US010948530B2

(12) United States Patent
Liu Zhu et al.

(10) Patent No.: US 10,948,530 B2
(45) Date of Patent: Mar. 16, 2021

(54) APPARATUS AND METHOD FOR ASYMMETRICAL ISOLATION MONITOR FAILURE DETECTION

(71) Applicant: Lear Corporation, Southfield, MI (US)

(72) Inventors: Ivan Liu Zhu, Valls (ES); Josep Vallverdu Guasch, Valls (ES)

(73) Assignee: LEAR CORPORATION, Southfield, MI (US)

( * ) Notice: Subject to any disclaimer, the term of this patent is extended or adjusted under 35 U.S.C. 154(b) by 215 days.

(21) Appl. No.: 16/173,977

(22) Filed: Oct. 29, 2018

(65) Prior Publication Data
US 2020/0132745 A1  Apr. 30, 2020

(51) Int. Cl.
*G01R 31/00* (2006.01)
*G07C 5/08* (2006.01)
*G01R 27/02* (2006.01)

(52) U.S. Cl.
CPC .......... *G01R 31/007* (2013.01); *G01R 27/02* (2013.01); *G07C 5/08* (2013.01)

(58) Field of Classification Search
CPC .... G01R 27/02; G01R 31/007; G01R 27/025; G01R 35/00; G07C 5/08
See application file for complete search history.

(56) References Cited

U.S. PATENT DOCUMENTS

| | | | |
|---|---|---|---|
| 6,919,726 B2 * | 7/2005 | Yudahira | B60L 3/0023 324/522 |
| 7,554,333 B2 * | 6/2009 | Morita | B60L 3/0053 324/509 |
| 8,040,139 B2 * | 10/2011 | Plagens | G01R 31/50 324/509 |
| 8,168,315 B1 * | 5/2012 | Hermann | H01M 10/486 429/92 |
| 10,416,234 B2 * | 9/2019 | Zhou | G01R 31/3278 |
| 2007/0285057 A1 * | 12/2007 | Yano | B60L 3/12 320/116 |
| 2008/0231286 A1 * | 9/2008 | Tsunekazu | G01R 31/50 324/509 |
| 2009/0179655 A1 * | 7/2009 | Trenchs Magana | H02H 5/12 324/537 |
| 2009/0278547 A1 * | 11/2009 | Acena | G01R 31/52 324/509 |
| 2009/0323233 A1 * | 12/2009 | Shoemaker | G01R 31/005 361/42 |

(Continued)

*Primary Examiner* — Babar Sarwar (74) *Attorney, Agent, or Firm* — Brooks Kushman P.C.

(57) ABSTRACT

In at least one embodiment, an apparatus for monitoring isolation resistance in a vehicle is provided. The apparatus includes at least one controller that is configured to at least one of activate and deactivate any number of the plurality of switches and to perform a plurality of measurements on a high voltage system. The at least one controller is further configured to determine an isolation resistance between the high voltage system and the low voltage system based on the plurality of measurements and to determine a first resistance between the positive branch and a ground of the low voltage system based at least on the isolation resistance. The at least one controller is further configured to determine whether the isolation resistance of the high voltage system is exhibiting a symmetric failure, or an asymmetric failure based at least on the first resistance.

20 Claims, 6 Drawing Sheets

(56) References Cited

U.S. PATENT DOCUMENTS

| | | | |
|---|---|---|---|
| 2010/0259276 A1* | 10/2010 | Streit | G01R 31/3835 |
| | | | 324/525 |
| 2011/0307196 A1* | 12/2011 | Schumacher | G01R 31/52 |
| | | | 702/58 |
| 2013/0106437 A1* | 5/2013 | Herraiz | G01R 27/18 |
| | | | 324/615 |
| 2013/0278272 A1* | 10/2013 | Kaminski | B60L 3/0069 |
| | | | 324/510 |
| 2014/0214262 A1* | 7/2014 | Iwanabe | G01R 31/50 |
| | | | 701/31.7 |
| 2015/0285851 A1* | 10/2015 | Kawamura | B60L 3/0069 |
| | | | 324/509 |
| 2015/0346257 A1* | 12/2015 | Tabatowski-Bush | |
| | | | G01R 35/00 |
| | | | 324/503 |
| 2016/0096433 A1* | 4/2016 | Gale | G01R 27/025 |
| | | | 701/31.9 |
| 2016/0214484 A1* | 7/2016 | Gale | B60L 3/0069 |
| 2016/0252555 A1* | 9/2016 | Deumal Herraiz | G01R 35/00 |
| | | | 324/503 |
| 2018/0045767 A1* | 2/2018 | Daigle | B60L 50/51 |
| 2018/0079310 A1* | 3/2018 | Kawashima | B60W 10/06 |
| 2018/0267094 A1* | 9/2018 | Moertl | B60L 3/12 |

* cited by examiner

| Riso | Riso Safe Area | Decision of Vehicle Availability | Rp | Rn | Rp Safe Area | Rn Safe Area | Decision of Vehicle Availability |
|---|---|---|---|---|---|---|---|
| 5Meg | YES | Acceptable | 10Meg | 10Meg | YES | YES | Safe |
| 99k | NO | Acceptable - Notify User | 10Meg | 100k | YES | NO | Caution |
| 99k | NO | Acceptable - Notify User | 100k | 10Meg | NO | YES | Caution |
| 125k | NO | Unacceptable | 250k | 250k | YES | YES | Safe |
| 100,5k | NO | Acceptable - Notify User | 201k | 201k | YES | YES | Caution* |
| 25k | NO | Unacceptable | 50k | 50k | NO | NO | Unacceptable |

Fig-10

APPARATUS AND METHOD FOR ASYMMETRICAL ISOLATION MONITOR FAILURE DETECTION

TECHNICAL FIELD

Aspects disclosed herein generally relate to an apparatus and method for asymmetrical isolation monitor failure detection for a vehicle. These aspects and others will be discussed in more detail herein.

BACKGROUND

U.S. Publication No. 2016/0252555 to Herraiz et al. provides an apparatus for diagnosing electronics in an insulation resistance monitoring system. The apparatus includes a controller for being electrically coupled to a plurality of electronics including a plurality of switches that are electrically coupled to a positive branch and to a negative branch in a high voltage network and a low voltage network. The plurality of electronics is configured to perform insulation resistance monitoring in a vehicle. The controller is further configured to at least one of activate and deactivate any number of the plurality of switches to determine an overall voltage of the positive branch and the negative branch. The controller is further configured to detect a fault in at least one of the positive branch and the negative branch that corresponds to a failure of any one of the plurality of electronics based on the overall voltage.

SUMMARY

In at least one embodiment, an apparatus for monitoring isolation resistance in a vehicle is provided. The apparatus includes at least one controller for being electrically coupled to a plurality of switches that are electrically coupled to a positive branch and a negative branch of a high voltage system and to a ground of a low voltage system. The at least one controller is further configured to at least one of activate and deactivate any number of the plurality of switches and to perform a plurality of measurements on the high voltage system in response to the at least one of activating and deactivating any number of the plurality of switches. The at least one controller is further configured to determine an isolation resistance between the high voltage system and the low voltage system based on the plurality of measurements and to determine a first resistance between the positive branch and the ground of the low voltage system based at least on the isolation resistance. The at least one controller is further configured to determine whether the isolation resistance of the high voltage system is exhibiting a symmetric failure, or an asymmetric failure based at least on the first resistance.

In at least another embodiment, an apparatus for monitoring isolation resistance in a vehicle is provided. The apparatus includes at least one controller for being electrically coupled to a plurality of switches that are electrically coupled a positive branch and a negative branch of a high voltage system to a low voltage system. The at least one controller is further configured to at least one of activate and deactivate any number of the plurality of switches and to perform a plurality of measurements on the high voltage system in response to the at least one of activating and deactivating any number of the plurality of switches. The at least one controller is further configured to determine an isolation resistance between the high voltage system and the low voltage system based on the plurality of measurements and to determine a first resistance between the positive branch and a ground of the low voltage system and a second resistance between the negative branch and the ground of the low voltage system based at least on the isolation resistance. The at least one controller is further configured to determine whether the isolation resistance of the high voltage system is exhibiting a symmetric failure, or an asymmetric failure based on the first resistance and on the second resistance.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The embodiments of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a computer-program that is embodied in a non-transitory computer readable medium programmed to perform any number of the functions as disclosed.

Figure 1:
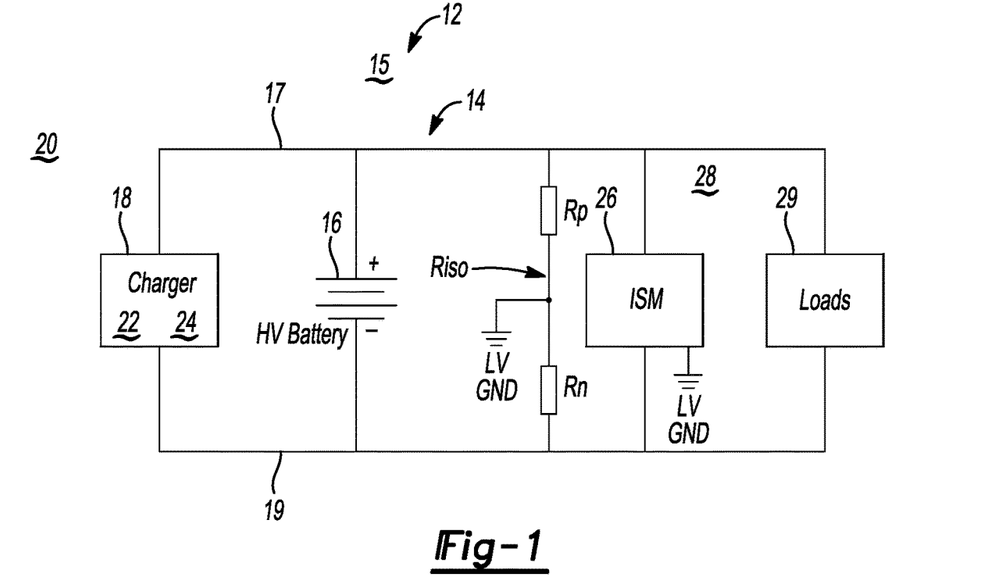
FIG. 1 depicts one example of an isolation monitoring system.

FIG. 1 illustrates an example of one isolation monitoring system 10. For electric vehicles (EVs), a battery electric vehicle (BEV), a hybrid electric vehicle (HEV) and plug-in electric vehicles (PHEVs), the system 10 may include a high voltage system 12 that includes a main power distribution network 14 with voltages beyond 60V and possibly up to 1000V in a vehicle 15. The high voltage system 12 interconnects a high voltage battery 16 to various high voltage-based devices (or loads 29) in the vehicle 15. A battery charger 18 is positioned in the vehicle 15 and converts an incoming AC voltage into a DC voltage for storage on the high voltage battery 16. The battery charger 18 includes a DC/DC converter 22 and an AC/DC converter 24. The AC/DC converter 24 inverts the incoming AC voltage into a DC voltage and the DC/DC converter 22 converts the DC voltage into a voltage that suitable for storage on the high voltage battery 16.

In general, according to specific standards about electrical safety, EVs, BEVs, HEVs, and PHEVs are requested to meet standard ISO6469. The high voltage system 12 generally required to incorporate an Isolation Monitor (ISM) stage 26 that includes electronic circuit(s) (not shown) that monitors an isolation resistance (Riso) that is present between the high voltage system 12 and a low-voltage (LV) system 28. For example, it is recognized that the ISM stage 26 includes various resistors, switches, and/or controllers (not shown) to performing isolation monitoring. In addition, the battery charger 18 may include electronic circuit(s) (not shown) that may control the ISM stage 26 to monitor an isolation resistance (Riso) that is present between the high voltage system 12 and the LV system 28. It is recognized that the battery charger 18 may include various resistors, switches, and/or controllers (not shown) to control the ISM stage 26 and/or perform isolation monitoring.

Standard automotive components such as heating/cooling devices, power windows, entertainment systems, vehicle lighting, locking/unlocking devices, etc. generally comprise the LV system 28. Riso is generally characterized by Rp and Rn resistance values as illustrated in FIG. 1. Rp may correspond to a resistance of a positive branch 17 of the high voltage system 12. Rn may correspond to a resistance of a negative branch 19 of the high voltage system 12. For example, Riso may be the result of both Rp and Rn and is generally seen in parallel (e.g., Riso=Rp//Rn). FIG. 1 illustrates an example of an overall configuration of a HV system with the ISM stage 26 to measure the isolation resistance (Riso). It is noted that Riso, Rp, and Rn are not actual resistor values for the purpose of enabling voltage transfer between the high voltage system 12 and the low voltage system 28. Rather, Riso is indicative of a resistance formed between the HV system 12 and the LV system 28 based on Rp and Rn. It is recognized that there is a leakage path between the high voltage system 12 and a ground (e.g. chassis ground) (as illustrated in FIG. 1) of the low voltage system 28. It is recognized that Rp and Rn are not actual resistor values. Rather, Rp and Rn provide values indicative of the amount of leakage between the HV system 20 and the ground of the low voltage system 28. For example, Rp corresponds to a measure of an overall resistance of the positive branch 17 of the high voltage system 12 with respect to the ground of the low voltage system 28 and Rn corresponds to a measure of an overall resistance of a negative branch 19 of the high voltage system 12 with respect to the ground of the low voltage system 28.

In general, EVs, BEVs, HEVs, and PHEVs (and as shown in FIG. 1) may include the high voltage system 12 and the low voltage system 28. The low voltage system 28 may be grounded to a vehicle chassis (or the LV ground as illustrated in FIG. 1) whereas the high voltage system 12 may include a floating ground, for example, a ground that is not connected to the vehicle chassis (or the ground of the LV system 28). Because the high voltage system 12 is not grounded to the same ground as the vehicle chassis, a potential may exist for an electrical discharge between the high voltage system 12 and the low voltage system 28. The voltage of the high voltage system 12 is relatively large. Thus, it is desirable to provide a certain amount of insulation between the high voltage system 12 and the low voltage system 28. This amount of isolation generally corresponds to the insulation resistance (Riso). Thus, the ISM stage 26 is generally configured to measure the insulation resistance and to provide a warning when the insulation resistance does not meet a predetermined resistance value.

The amount of insulation resistance may be based on an amount of impedance (or insulation) that is present between the high voltage system 12 and the ground of the LV system 28. The impedance between the high voltage system 12 and the ground of the LV system 28 may be assessed prior to vehicle startup and can be performed periodically. This pre-activation impedance determination may be beneficial in assessing the insulation resistance prior to operation of the high voltage system 12.

The various ISM implementations may only provide an insulation resistance measurement output. However, the insulation resistance value (or measurement output alone) may provide a complete perspective of various failures present in the system 10. The measured insulation resistance (Riso) may not separately distinguish between Rp and Rn values as illustrated in FIG. 1. As noted above, Rp corresponds to a resistance of the positive branch 17 with respect to the ground of the LV system 28 and Rn corresponds to a resistance of the negative branch 19 with respect to the ground of the low voltage system 28. A detected isolation failure (e.g., a measured low value of the insulation resistance (or low Riso value)) may be attributed to poor or low isolation in both the positive and negative branches 17, 19 but may also be due to a low value at only one branch while the other branch may not be compromised or is in a "safe" condition. There may be two types of failures with respect to the insulation resistance. For example, there may be a symmetric isolation failure and an asymmetric isolation failure. Each type of failure may have a different criticality that affects the operation of the vehicle 15 and may lead to either the vehicle 15 not being operational given the severity of the failure (i.e., the vehicle 15 may be blocked) or the vehicle 15 may be permitted to operate on a limited basis to enable a user the opportunity to take the vehicle 15 in for servicing in the event the isolation failure is not considered severe. In general, with a symmetric failure, current may flow within the high voltage system 12 and through the low voltage system 28. Thus, embodiments disclosed herein generally provide, among other things, an apparatus and method that performs isolation resistance monitoring to determine whether the failure corresponds to a symmetric type failure or to an asymmetric type failure. The severity of the failure may be based on whether the failure is of a symmetric type or an asymmetric type. These aspects and others will be discussed in more detail below.

Figure 2:
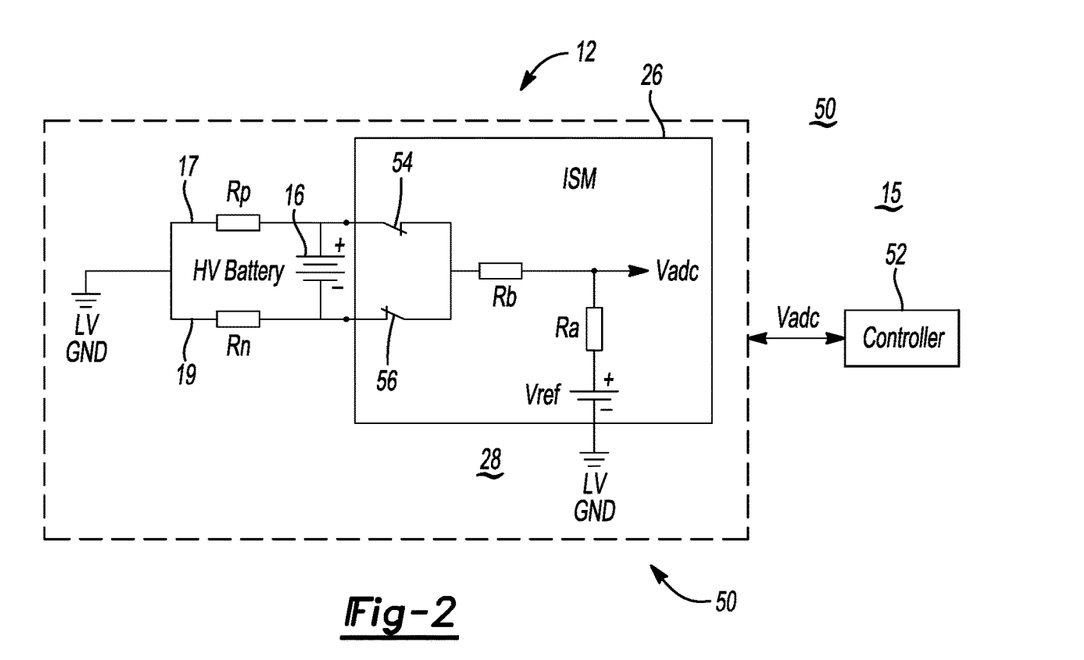
FIG. 2 depicts an apparatus for performing isolation monitoring in a vehicle in accordance to one embodiment.

FIG. 2 depicts a system 50 for performing isolation monitoring in the vehicle 15 in accordance to one embodiment. The system 50 generally includes the ISM stage 26 which includes at least one isolation resistance monitoring (ISM) controller 52 (hereafter "the ISM controller 52") that is operably coupled to the high voltage system 12 and the low voltage system 28. It is recognized that the ISM controller 52 may be implemented within the high voltage system 12 or alternatively in the low voltage system 28. The ISM controller 52 may be packaged or implemented within the ISM stage 26 or alternatively outside of the ISM stage 26. FIG. 2 illustrates that the ISM controller 52 is packaged separate from the ISM stage 26. The ISM stage 26 further includes a first switch 54 and a second switch 56. The ISM controller 52 is configured to selectively control the first switch 54 and the second switch 56 in order to measure the isolation resistance (e.g. Rp and Rn). For example, the ISM controller 52 may monitor a voltage output on an input Vadc to perform the measurement of the isolation resistance. The ISM stage 26 generally includes a power supply (or Vref) on the low voltage system 28. In addition, the ISM stage 26 further includes resistors, Ra and Rb which generally correspond to an equivalent of resistances within the ISM stage 26 and are known values.

In a first isolation resistance measurement, the ISM controller 52 controls the first switch 54 and the second switch 56 to open. In this case, the ISM controller 52 receives voltage, Vref on the input Vadc when the first switch 54 and the second switch 56 are open.

In a second isolation resistance measurement, the ISM controller 52 controls the first switch 54 to close and the second switch 56 to open. In this case, the ISM controller 52 receives the following voltage on the input Vadc:

Vadc="ug1$m$" (where ug1$m$ is the value of the voltage sensed on the input pin (e.g., Vadc)) while the ISM controller 52 controls the first switch 54 to close and the second switch 56 to open. The ISM controller 52 also receives a measurement corresponding to an instant voltage value of the HV battery 16 (e.g., ut1) from another controller in the vehicle 15 during second isolation resistance measurement. It is recognized that the ISM controller 52 may also measure the voltage of the HV battery 16 (e.g., ut1) during the second isolation resistance measurement.

Figure 3:
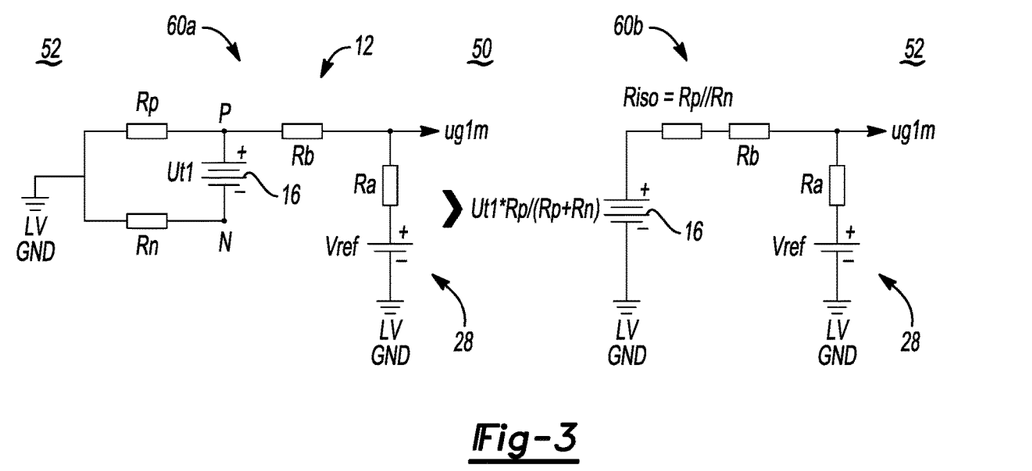
FIG. 3 depicts an example of the apparatus in a first measurement state in accordance to one embodiment.

FIG. 3 illustrates equivalent circuits 60$a$ and 60$b$ corresponding to the system 50 when the ISM controller 52 controls the first switch 54 to close and the second switch 56 to open while performing the second isolation resistance measurement. Circuit 60$b$ corresponds to Thevenin's equivalent of circuit 60$a$.

In third isolation resistance measurement, the ISM controller 52 controls the first switch 54 to open and the second switch 56 to close. In this case, the ISM controller 52 receives the following voltage on the input Vadc:

Vadc="ug2$m$" (where ug2$m$ is the value of the voltage sensed on the input pin) (e.g., Vadc)) while the ISM controller 52 controls the controls the first switch 54 to open and the second switch 56 to close. The ISM controller 52 also receives a measurement corresponding to an instant voltage value of the HV battery 16 (e.g., ut2) from another controller in the vehicle 15 during the third isolation resistance measurement. It is recognized that the ISM controller 52 may also measure the voltage of the HV battery 16 (e.g., ut2) during the second isolation resistance measurement.

Figure 4:
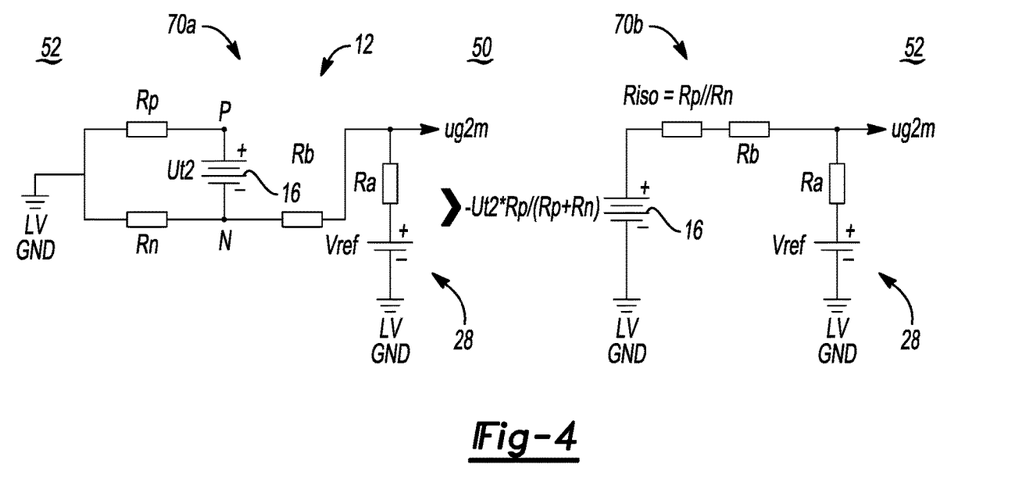
FIG. 4 depicts an example of the apparatus in a second measurement state in accordance to another embodiment.

FIG. 4 illustrates equivalent circuits 70$a$ and 70$b$ corresponding to the system 50 when the ISM controller 52 controls the first switch 54 to open and the second switch 56 to close while performing the third isolation resistance measurement. Circuit 70$b$ corresponds to Thevenin's equivalent of circuit 70$a$.

In general, the ISM controller 52 determines the isolation resistance (Riso) based on the following:

$$Riso = \frac{Ra*(ut1*ut2+ut1+ug2m-ut2*ug1m)}{ut1*Vref-ut2*Vref-ut1*ug2m+ut2*ug1m} - Rb \quad \text{(Eq. 1)}$$

where ut1 corresponds to the voltage across the high voltage battery 16 during the second isolation resistance measurement and ut2 corresponds to the voltage across the high voltage battery 16 during the third isolation resistance measurement) Riso is defined as Rp//Rn (or Riso generally corresponds to a resistive network in which Rp is in parallel to Rn). As noted above, the system 50 is generally configured to separately determine Rp (e.g. the resistance of the positive branch 17 of the high voltage system 12) and Rn (e.g., the resistance of the negative branch of the high voltage system 12). This aspect will be described in more detail hereafter.

In general, the equations of ug1$m$ and ug2$m$ as set forth in equation 1 are obtained by the following:

$$ug1m = ut1 * \frac{Rp}{Rp+Rn} * \frac{Ra}{Ra+Rb+Riso} + Vref * \frac{Riso+Rb}{Ra+Rb+Riso} \quad \text{(Eq. 2)}$$

$$ug2m = -ut2 * \frac{Rn}{Rp+Rn} * \frac{Ra}{Ra+Rb+Riso} + Vref * \frac{Riso+Rb}{Ra+Rb+Riso} \quad \text{(Eq. 3)}$$

In general, ug1$m$ and ug2$m$ are known values as determined by the ISM controller 52 in connection with the second isolation resistance measurement and the third isolation resistance measurement as noted above. Equations 2 and 3 illustrate the impact of each variable with respect to ug1*m* and ug2*m*. Ra and Rb generally correspond to an equivalent of resistances within the ISM stage 26 and are known values. Ra and Rb are utilized to obtain the values for ug1*m* and ug2*m* during the second isolation resistance measurement and the third isolation resistance measurement.

Thus, it is possible to obtain new variables (e.g., ug1*m*0 and ug2*m*0) if the second term is subtracted as Riso is known already as exhibited in equations 4 and 5 below:

$$ug1mO = ug1m - Vref * \frac{Riso + Rb}{Ra + Rb + Riso} = \qquad (Eq.\ 4)$$
$$ut1 * \frac{Rp}{Rp + Rn} * \frac{Ra}{Ra + Rb + Riso}$$

$$ug2mO = ug2m - Vref * \frac{Riso + Rb}{Ra + Rb + Riso} = \qquad (Eq.\ 5)$$
$$-ut2 * \frac{Rn}{Rp + Rn} * \frac{Ra}{Ra + Rb + Riso}$$

By dividing ug1*m*0 and ug2*mo*, it is possible to obtain a direct relationship for Rp and Rn as shown below.

$$\text{Ratio} = \frac{|ug1mO|}{|ug2mO|} = \frac{ut1}{ut2} * \frac{Rp}{Rn} \qquad (Eq.\ 6)$$

Therefore, in light of Eq. 6, Rp and Rn values can be solved with Riso as shown directly below.

$$\text{Ratio} = \frac{|ug1mO|}{|ug2mO|} = \frac{ut1}{ut2} * \frac{Rp}{Rn} \qquad (Eq.\ 7)$$

$$Rn = \frac{Riso * \left(\text{Ratio} * \frac{ut2}{ut1} + 1\right)}{\text{Ratio} * \frac{ut2}{ut1}} = Riso + \frac{Riso}{\text{Ratio}} * \frac{ut1}{ut2} \qquad (Eq.\ 8)$$

$$Rp = Rn * \text{Ratio} * \frac{ut2}{ut1} \qquad (Eq.\ 9)$$

Thus, as shown above, it is possible to independently determine the values for Rp and Rn and it is also possible to determine asymmetric and symmetric failures for the system 50.

Figure 5:
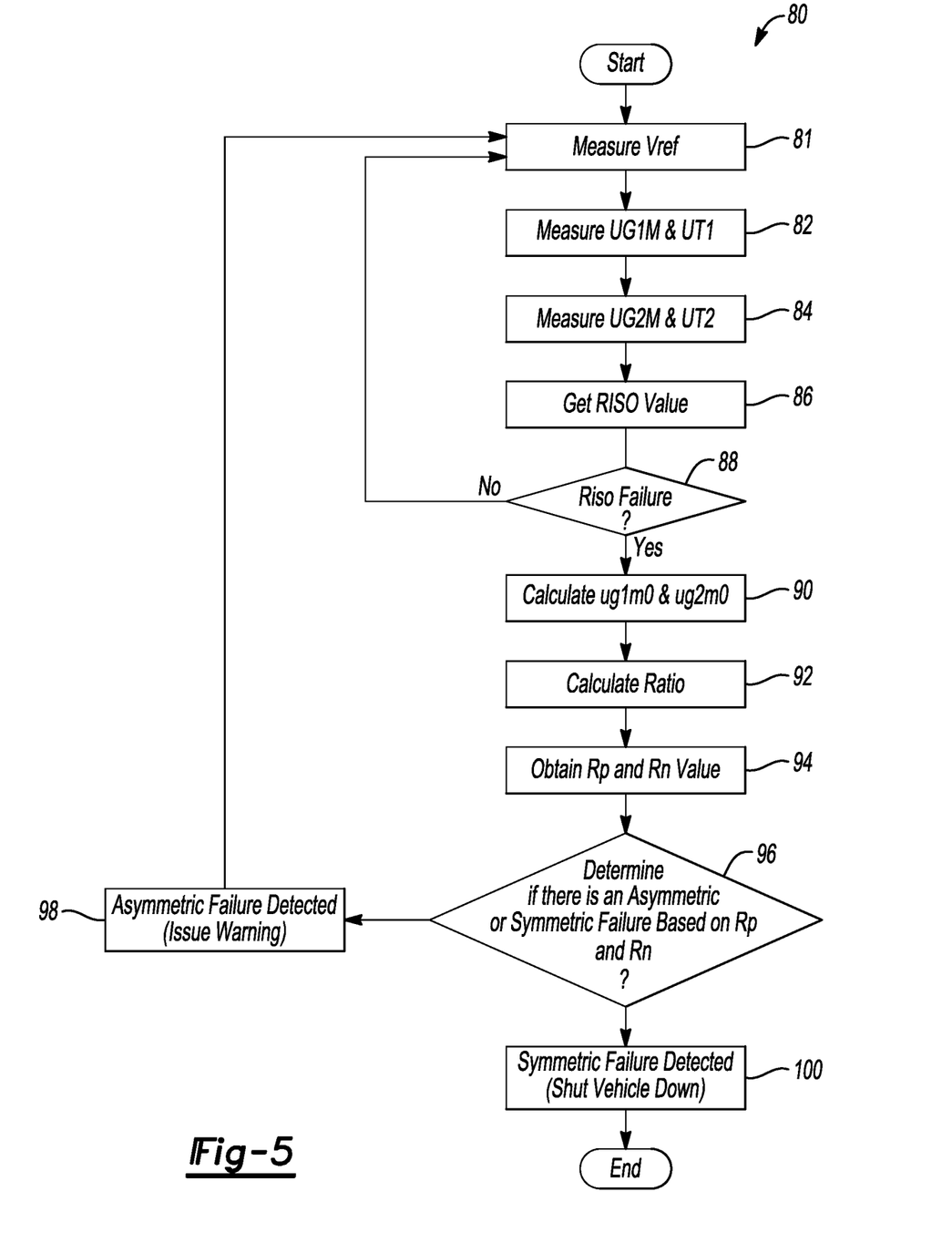
FIG. 5 depicts a method for performing isolation monitoring in a vehicle in accordance to one embodiment.

FIG. 5 depicts a method 80 for performing isolation monitoring in a vehicle in accordance to one embodiment.

In operation 81, the ISM controller 52 measures Vref in response to controlling the first switch 54 and the second switch 56 to open.

In operation 82, the ISM controller 52 measures ug1*m* and ut1 by performing the second isolation resistance measurement. For example, the ISM controller 52 controls the first switch 54 to close and the second switch 56 to open and measures ug1*m* and obtains a value (e.g., ut1) which corresponds to an instant voltage value of the HV battery 16 while the second isolation resistance measurement is performed.

In operation 84, the ISM controller 52 measures ug2*m* and ut2 by performing the third isolation resistance measurement. For example, the ISM controller 52 controls the first switch 54 to open and the second switch 56 to close and measures ug2*m* and obtains a value (e.g., ut2) which corresponds to an instant voltage value of the HV battery 16 while the third isolation resistance measurement is performed.

In operation 86, the ISM controller 52 determines Riso based on Vref, ut1, ut2, ug1*m*, ug2*m*, Ra, and Rb.

In operation 88, the ISM controller 52 determines if Riso is below a threshold. For example, the ISM controller 52 compares Riso against a predetermined resistance value (e.g., 100 KOhms). If Riso is less than the predetermined resistance value, then the method 80 proceeds to operation 90. If Riso is greater than the predetermined resistance value, then the method 80 proceeds back to operation 81 and the high voltage system 12 is determined to be properly isolated from the low voltage system 28.

In operation 90, the ISM controller 52 determines ug1*mo* based on ug1*m*, Vref, Riso, Ra, and Rb. The ISM controller 52 determines ug2*mo* based on ug1*m*, Vref, Riso, Ra, and Rb.

In operation 92, the ISM controller 52 takes a ratio of ug1*mo* and ug2*mo* (e.g., see equations 6 and 7).

In operation 94, the ISM controller 52 determines Rp and Rn. For example, the ISM controller 52 determines Rn based on Riso, the ratio as determined in operation 92, ut1, and ut2. In addition, the ISM controller 52 determines Rp based on Rn, the ratio as determined in operation 92, ut1, and ut2.

In operation 96, the ISM controller 52 determines whether Rp is above or below a positive net resistance threshold and whether Rn is above or below a negative net resistance threshold. In one example, each of the positive net resistance threshold and the negative net resistance threshold may be 200 kOhms. If the ISM controller 52 determines that only one of Rp or Rn is below its corresponding threshold, then the method moves to operation 98. If the ISM controller 52 determines that Rp is below the positive net resistance threshold and that Rn is below the negative net resistance threshold, then the method 80 moves to operation 100.

Figure 6:
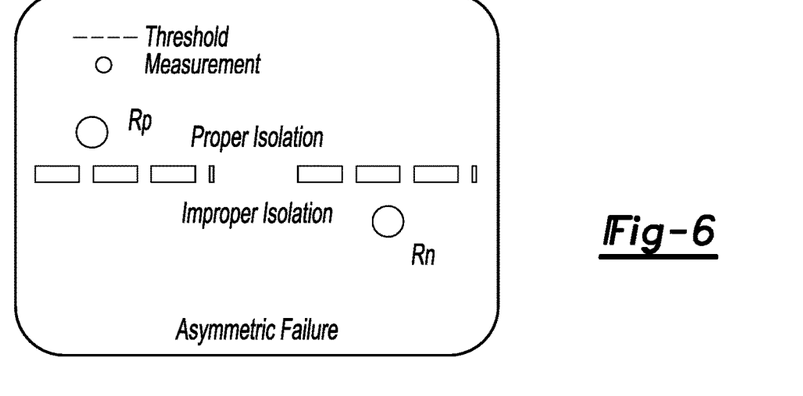
FIG. 6 depicts an example of an asymmetric failure in accordance to one embodiment.

In operation 98, the ISM controller 52 determines the presence of an asymmetric failure and generates an alert to notify the user of the failure of either Rp or Rn. In this case, the vehicle 15 may be considered safe and operable and that it is unnecessary to shut the vehicle 15 down. FIG. 6 provides an example of an asymmetric failure.

In operation 100, the ISM controller 52 determines the presence of a symmetric failure and shuts the vehicle down since Rp and Rn are each below their respective thresholds. In this case, there is not enough isolation between the high voltage system 12 and the low voltage system 28.

FIG. 6 depicts an example of an asymmetric failure in accordance to one embodiment. The ISM controller 52 determines Rp (e.g. the resistance of the positive branch 17 and the ground of the LV system 28) and Rn (e.g., the resistance of the negative branch 19 and the ground of the LV system 28). The ISM controller 52 determines that the value for Rp provides an adequate level (or safe level) of isolation between the positive branch 17 of the high voltage system 12 and the vehicle ground. The ISM controller 52 determines that the value for Rn provides an unacceptable level of isolation between the negative branch 19 of the high voltage system 12 and the vehicle ground. In this case since the value for Rp provides for an adequate level of isolation between the high voltage system 12 and the vehicle ground, the ISM controller 52 may generate an alert to notify the user of the failure with respect to Rn. However, in this case, the vehicle 15 may be considered safe and operable and it is unnecessary to shut the vehicle 15 down thereby reducing warranty costs. The actual thresholds for determining whether Rp and/or Rn are acceptable may be based on Original Equipment Manufacturer (OEM) requirements which may vary based on the vehicle and manufacturer. Because Rp is considered to provide an acceptable level of isolation and Rn is considered to provide an unacceptable level of isolation, such a condition is indicative of an asymmetric failure.

Figures 7, 9:
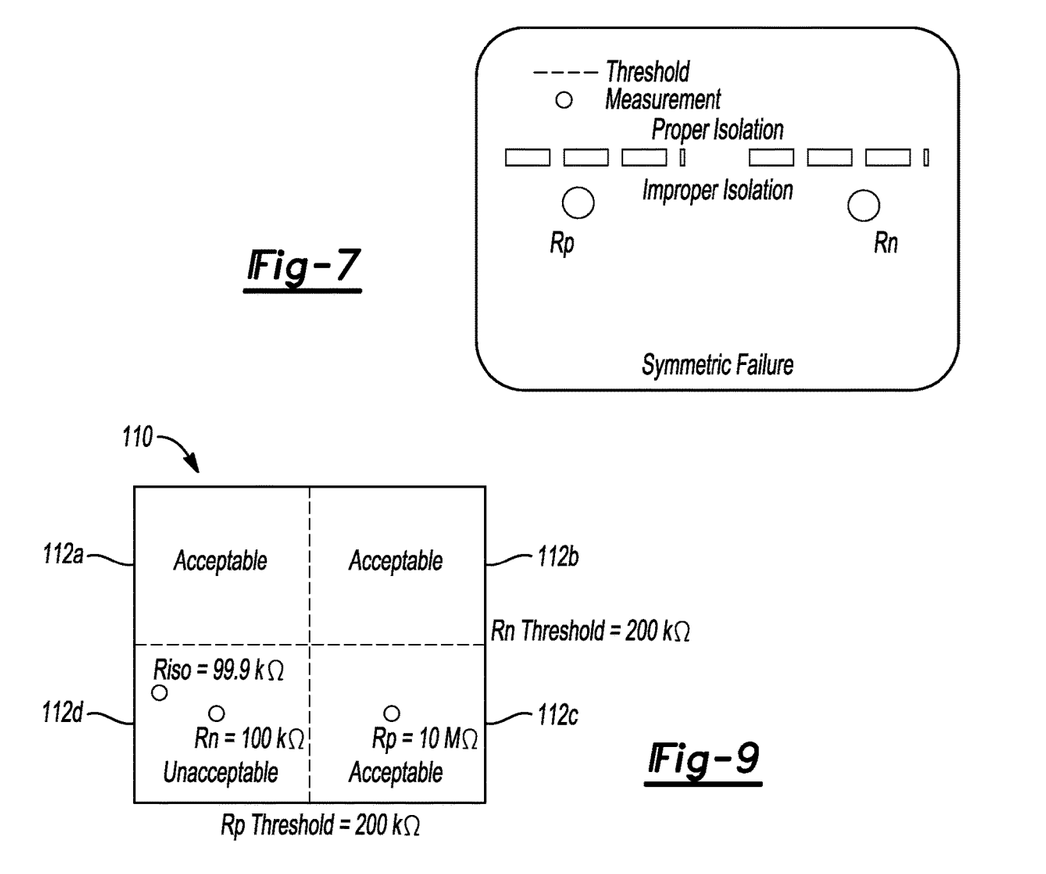
FIG. 7 depicts an example of a symmetric failure in accordance to one embodiment.
FIG. 9 corresponds to a plot that depicts various zones which indicate a severity level for determined Riso, Rp, and Rn values in accordance to one embodiment.

FIG. 7 depicts an example of a symmetric failure in accordance to one embodiment. The ISM controller 52 determines Rp (e.g. the resistance of the positive branch 17 and the ground of the LV system 28) and Rn (e.g., the resistance of the negative branch 19 and the ground of the LV system 28). The ISM controller 52 determines that the value for Rp provides an unacceptable level of isolation between the positive branch 17 of the high voltage system 12 and a vehicle ground. Likewise, the ISM controller 52 determines that the value for Rn provides an unacceptable level of isolation between the negative branch 19 of the high voltage system 12 and the vehicle ground. Given that both Rp and Rn provide for an unacceptable level of isolation, such a condition is indicative of a symmetric failure and in this case the ISM controller 52 may transmit a signal to notify other controller(s) in the vehicle 15 to shut down or block operation of the vehicle 15.

Figure 8:
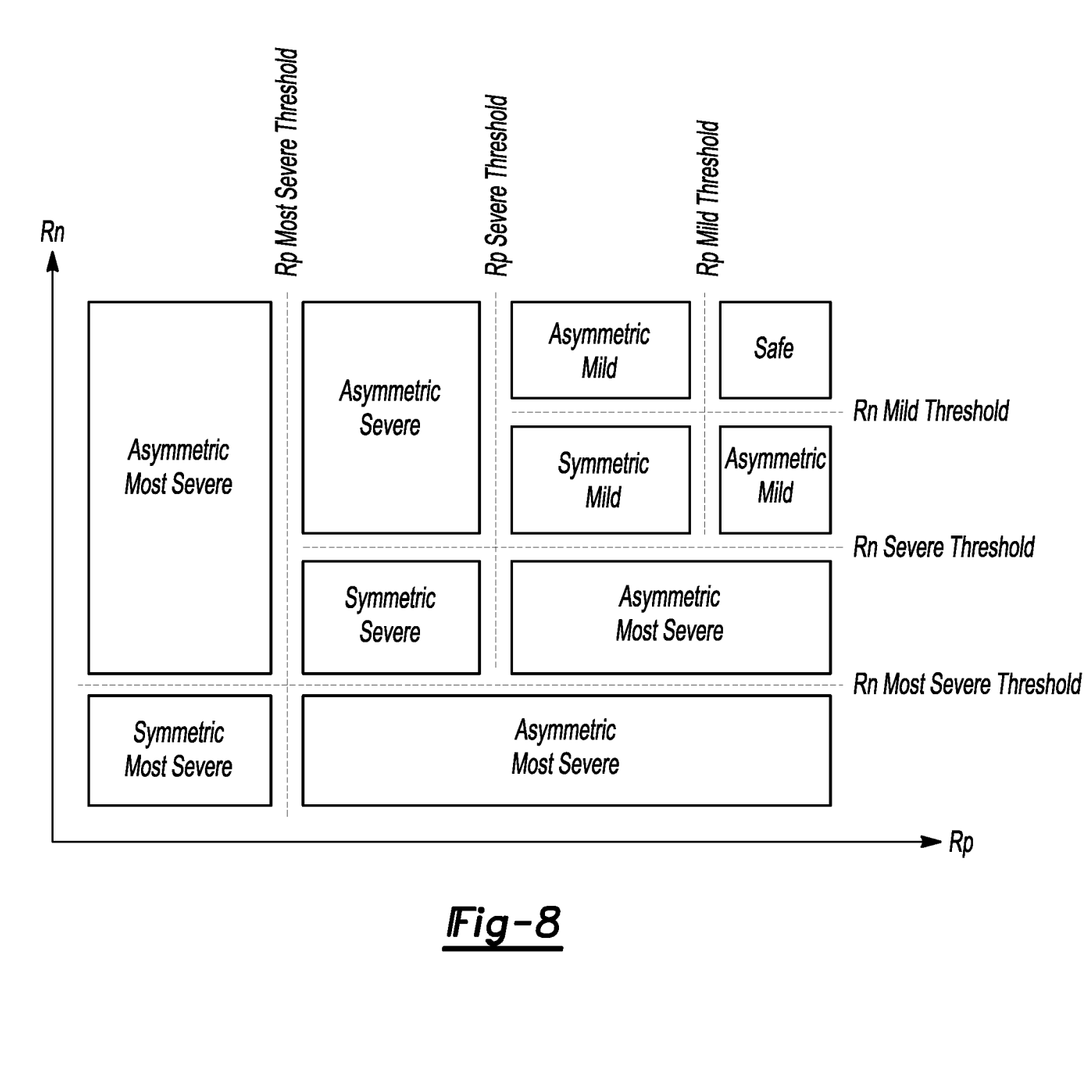
FIG. 8 depicts various asymmetric and symmetric regions based on the determined Rp and Rn after measurements are performed in accordance to another embodiment.

FIG. 8 depicts various asymmetric and symmetric regions based on the determined Rp and Rn after measurements are performed. For example, FIG. 7 illustrates a "Symmetric Most Severe" region, an "Asymmetric Most Severe" region, an "Asymmetric Severe" region, a "Symmetric Severe" region and so on. In general, each region is defined by predetermined values of Rp and Rn with a corresponding high and low threshold. Generally speaking, each OEM may determine the degree of severity for a determined Rp and Rn that falls within a corresponding region and the manner in which the vehicle 15 may respond accordingly. For example, one OEM may not consider a determined value of Rp and Rn that falls within region "Asymmetric Severe" significant enough to warrant preventing operation of the vehicle 15 and thereby necessitating immediate repair. In this case, the vehicle 15 may provide an alert to the driver to take the vehicle 15 in for servicing at a time that is convenient to the driver. However, another OEM may consider that a determined value of Rp and Rn that falls within region "Asymmetric Severe" is significant enough to warrant preventing operation of the vehicle 15 and thus requiring immediate repair. The response required by the driver based on the measured Rp and Rn varies based on the OEM. As noted above, prior implementations may only determine the isolation resistance (Riso) and if the determined isolation resistance (Riso) exceeded the threshold, this condition would indicate the vehicle was unsafe to drive and an immediate response may be necessary. However, in some occasions, the determined isolation resistance (Riso) may not be indicative of a severe fault. Given that the system 50 can determine Rp (e.g., the resistance of the positive branch 17) and Rn (e.g., the resistance of the negative branch 19), it is possible to avoid exposing the vehicle 15 to unnecessary warranty costs in moments where a severe issue does not truly exist.

FIG. 9 corresponds to a plot 110 that depicts various zones 112a, 112b, 112c, and 112d that indicate a severity level for determined Riso, Rp, and Rn values. As shown in the plot 110, any Riso value that is over a threshold of 100K, any Rp value that is over a threshold of 200K Ohms, and any Rn value that is over a threshold of 200K Ohms is generally indicative of a low severity condition for the high voltage system 12 (e.g., if Rp is below 200 k this may indicate an insulation fault on the positive branch 17 and if Rn is below 200K this may indicate an insulation fault on the negative branch 19). It is recognized that the ISM controller 52 compares the determined Riso, Rp, and Rn values to the noted thresholds above to determine the severity level for each value. In addition, the ISM controller 52 determines if there is a symmetric failure (e.g., each of the Rp and Rn determined values are below their corresponding threshold value) or an asymmetric failure (e.g., one of Rp or Rn is above its corresponding threshold value or the other of Rp and Rn is below its corresponding threshold).

Zone 112c illustrates a determined Rp value of 10M Ohms while zone 112d illustrates a determined Riso value of 100 K Ohms and a determined Rn value of 100 KOhms. In this case, the values for Riso and Rn are below the threshold values and thus indicate a severe condition with respect to the isolation resistance on the high voltage system 12. However, the determined Rp value corresponds to a less severe condition. The ISM controller 52 determines that there is an asymmetric fault (e.g., Rn is below the threshold while Rp is above the threshold). A corresponding OEM in this case may treat the failure as a mild isolation failure and will not impair the operation of the vehicle 15. Rather, the vehicle 15 may alert the driver to bring the vehicle 15 in for servicing and repair if necessary.

Figure 10:
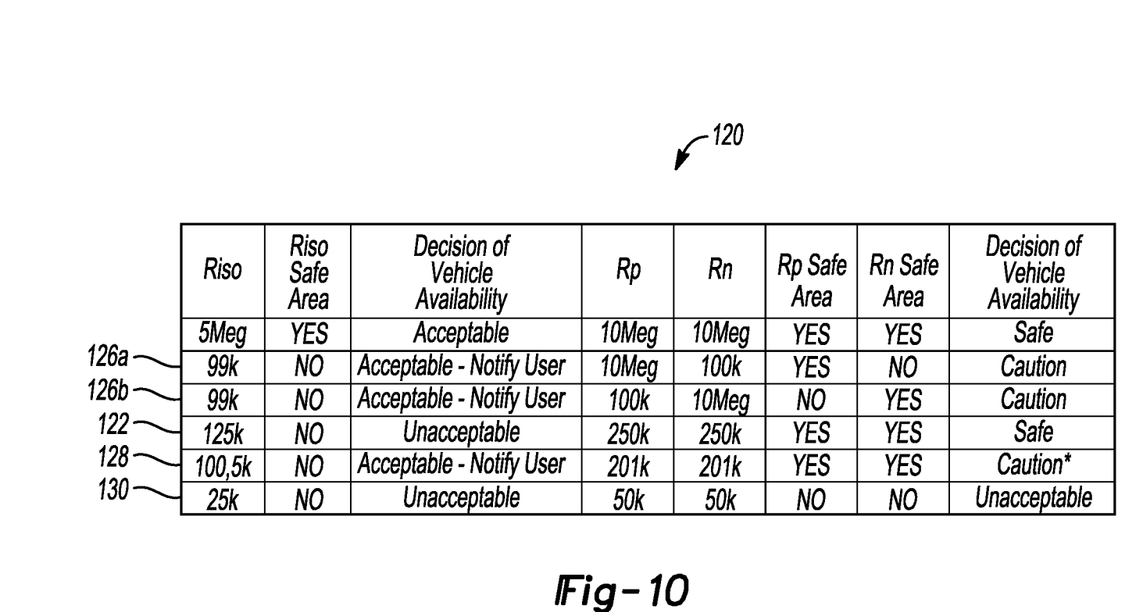
FIG. 10 is a chart depicting various diagnostic capabilities performed by an isolation monitor (ISM) controller in accordance to one embodiment.

FIG. 10 is a chart 120 depicting various diagnostic capabilities performed by the ISM controller 52 in accordance to one embodiment. The chart 120 illustrates different situations in which the system 50 improves vehicle availability to identify and resolve an isolation issue (e.g., either on the positive branch, the negative branch, or on both branches of the high voltage system 12). Row 122 generally indicates a condition in which the value for Riso is below a threshold value. However, in this case, the values for Rp and Rn each exceed their corresponding threshold (e.g., 200 Kohms). Here, this condition does not exhibit an isolation failure and the vehicle 15 is available without limitation for the driver. Row 126a generally indicates a condition whereby values for Riso and Rn are below their respective thresholds. However, the value for Rp is above its threshold. Thus, in the case the vehicle 15 is able to function and generates an alert to notify the driver to take the vehicle 15 in for servicing. Row 126b exhibits a similar condition however, Rp is detected to be below the threshold and Rn is detected to be above the threshold.

Row 128 exhibits the condition in which Riso is detected below the threshold while Rp and Rn are detected to be above their respective thresholds. Row 130 exhibits the condition in which each of Riso, Rp, and Rn are detected to be below their respective thresholds. It is recognized that the vehicle 15 may ignore, set a diagnostic trouble code (DTC), trigger an alert in the vehicle (e.g., visual and/or audio), or force the vehicle 15 to stop based on determined values of Riso, Rp and Rn.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An apparatus for monitoring isolation resistance in a vehicle, the apparatus comprising:
    at least one controller for being electrically coupled to a plurality of switches that are electrically coupled to a positive branch and a negative branch of a high voltage system, and to a ground of a low voltage system, the at least one controller being configured to:

at least one of activate and deactivate at least one of the plurality of switches;

perform a plurality of measurements on the high voltage system in response to the at least one of activating and deactivating the at least one of the plurality of switches;

determine an isolation resistance between the high voltage system and the low voltage system based on the plurality of measurements;

determine a first resistance between the positive branch and the ground of the low voltage system based at least on the isolation resistance; and determine whether the isolation resistance of the high voltage system is exhibiting a symmetric failure, or an asymmetric failure based at least on the first resistance.

2. The apparatus of claim 1, wherein the at least one controller is further configured to determine a second resistance between the negative branch and the ground of the low voltage system based at least on the isolation resistance.

3. The apparatus of claim 2, wherein the at least one controller is further configured to determine whether the isolation resistance of the high voltage system is exhibiting the symmetric failure, or the asymmetric failure based on the first resistance and the second resistance.

4. The apparatus of claim 3, wherein the at least one controller is further configured to compare the first resistance to a positive net resistance threshold.

5. The apparatus of claim 4, wherein the at least one controller is further configured to compare the second resistance to a negative net resistance threshold.

6. The apparatus of claim 5, wherein the at least one controller is further configured to determine that the isolation resistance of the high voltage system is exhibiting the symmetric failure when the first resistance is less than the positive net resistance threshold and when the second resistance is less than the negative net resistance threshold.

7. The apparatus of claim 6, wherein the at least one controller is further configured to disable operation of the vehicle in response to determining that the isolation resistance of the high voltage system is exhibiting the symmetric failure.

8. The apparatus of claim 5, wherein the at least one controller is further configured to determine that the isolation resistance of the high voltage system is exhibiting the asymmetric failure when the first resistance is less than the positive net resistance threshold or when the second resistance is less than the negative net resistance threshold.

9. The apparatus of claim 8, wherein the at least one controller is further configured to generate an alert to notify a user while enabling the user to drive the vehicle in response to determining that the isolation resistance of the high voltage system is exhibiting the asymmetric failure.

10. An apparatus for monitoring isolation resistance in a vehicle, the apparatus comprising:

at least one controller for being electrically coupled to a plurality of switches that electrically coupled to a positive branch and a negative branch of a high voltage system, and to a ground of a low voltage system, the at least one controller being configured to:

at least one of activate and deactivate at least one of the plurality of switches;

perform a plurality of measurements on the high voltage system in response to the at least one of activating and deactivating the at least one of the plurality of switches;

determine an isolation resistance between the high voltage system and the low voltage system based on the plurality of measurements;

determine a first resistance between the negative branch and the ground of the low voltage system based at least on the isolation resistance; and determine whether the isolation resistance of the high voltage system is exhibiting a symmetric failure, or an asymmetric failure based at least on the first resistance.

11. The apparatus of claim 10, wherein the at least one controller is further configured to determine a second resistance between the positive branch and the ground of the low voltage system based at least on the isolation resistance.

12. The apparatus of claim 11, wherein the at least one controller is further configured to determine whether the isolation resistance of the high voltage system is exhibiting the symmetric failure, or the asymmetric failure based on the first resistance and the second resistance.

13. The apparatus of claim 12, wherein the at least one controller is further configured to compare the first resistance of the positive branch to a negative net resistance threshold.

14. The apparatus of claim 13, wherein the at least one controller is further configured to compare the second resistance to a positive net resistance threshold.

15. The apparatus of claim 14, wherein the at least one controller is further configured to determine that the isolation resistance of the high voltage system is exhibiting the symmetric failure when the second resistance of the positive branch is less than the negative net resistance threshold and when the first resistance is less than the positive net resistance threshold.

16. The apparatus of claim 15, wherein the at least one controller is further configured to disable operation of the vehicle in response to determining that the isolation resistance of the high voltage system is exhibiting the symmetric failure.

17. The apparatus of claim 14, wherein the at least one controller is further configured to determine that the isolation resistance of the high voltage system is exhibiting the asymmetric failure when the first resistance is less than the negative net resistance threshold or when the second resistance is less than the positive net resistance threshold.

18. The apparatus of claim 17, wherein the at least one controller is further configured to generate an alert to notify a user while enabling the user to drive the vehicle in response to determining that the isolation resistance of the high voltage system is exhibiting the asymmetric failure.

19. An apparatus for monitoring isolation resistance in a vehicle, the apparatus comprising:

at least one controller for being electrically coupled to a plurality of switches that are electrically coupled to a positive branch and a negative branch of a high voltage system, and to a ground of a low voltage system, the at least one controller being configured to:

at least one of activate and deactivate at least one of the plurality of switches;

perform a plurality of measurements on the high voltage system in response to the at least one of activating and deactivating the at least one of the plurality of switches;

determine an isolation resistance of the vehicle based on the plurality of measurements;

determine a first resistance between the positive branch and the ground of the low voltage system based at least on the isolation resistance;

determine a second resistance between the negative branch and the ground of the low voltage system based at least on the isolation resistance; and determine whether the isolation resistance of the high voltage system is exhibiting a symmetric failure based on the first resistance and the second resistance.

20. The apparatus of claim 19, wherein the at least one controller is further configured to disable operation of the vehicle in response to determining that the isolation resistance of the high voltage system is exhibiting the symmetric failure.

\* \* \* \* \*